(12) United States Patent
Zhu et al.

(10) Patent No.: US 12,282,085 B2
(45) Date of Patent: Apr. 22, 2025

(54) RADAR SYSTEM AND CONTROL METHOD THEREFOR

(71) Applicant: CALTERAH SEMICONDUCTOR TECHNOLOGY (SHANGHAI) CO., LTD., Shanghai (CN)

(72) Inventors: Yan Zhu, Shanghai (CN); Jiashu Chen, Shanghai (CN); Leilei Huang, Shanghai (CN); Wenting Zhou, Shanghai (CN)

(73) Assignee: CALTERAH SEMICONDUCTOR TECHNOLOGY (SHANGHAI) TECHNOLOGY CO., LTD., Shanghai (CN)

( * ) Notice: Subject to any disclaimer, the term of this patent is extended or adjusted under 35 U.S.C. 154(b) by 863 days.

(21) Appl. No.: 17/297,406

(22) PCT Filed: Jun. 17, 2019

(86) PCT No.: PCT/CN2019/091576
§ 371 (c)(1),
(2) Date: Dec. 27, 2021

(87) PCT Pub. No.: WO2020/107867
PCT Pub. Date: Jun. 4, 2020

(65) Prior Publication Data
US 2022/0146661 A1    May 12, 2022

(30) Foreign Application Priority Data
Nov. 29, 2018   (CN) .......................... 201811445465.2

(51) Int. Cl.
*G01S 13/87* (2006.01)
*G01S 7/03* (2006.01)
(Continued)

(52) U.S. Cl.
CPC .............. *G01S 13/872* (2013.01); *G01S 7/03* (2013.01); *G01S 7/356* (2021.05); *H03M 1/12* (2013.01)

(58) Field of Classification Search
None
See application file for complete search history.

(56) References Cited

U.S. PATENT DOCUMENTS

| 10,061,016 B2 * | 8/2018 | Ginsburg .............. G01S 7/4008 |
| 2014/0232586 A1 * | 8/2014 | Ygnace ..................... G01S 7/02 342/195 |

(Continued)

OTHER PUBLICATIONS

China National Intellectual Property Administration, International Search Report and Written Opinion of the International Searching Authority mailed Sep. 23, 2019 for International Application No. PCT/CN2019/091576, 11 pages.

*Primary Examiner* — Vladimir Magloire
*Assistant Examiner* — David C. Schultz
(74) *Attorney, Agent, or Firm* — HAYNES AND BOONE, LLP

(57) ABSTRACT

A radar system and control method thereof is disclosed. The radar system comprises a plurality of radar units, each comprising: one or more radio frequency (RF) channels configured to receive a reflected signal and then generate an analog input signal according to the reflected signal; and a processing module connected with all the RF channels and configured to sample the analog input signal to obtain a digital signal and perform the first digital signal processing on the digital signal to obtain intermediate data, wherein when the plurality of radar units work jointly, a designated radar unit performs the second digital signal processing on the plurality of intermediate data provided by the plurality of radar units, thereby obtaining result data of the radar system.

29 Claims, 9 Drawing Sheets

(51) Int. Cl.
*G01S 7/35* (2006.01)
*H03M 1/12* (2006.01)

(56) References Cited

U.S. PATENT DOCUMENTS

| | | | |
|---|---|---|---|
| 2016/0018511 A1* | 1/2016 | Nayyar | G01S 7/03 342/27 |
| 2016/0146931 A1* | 5/2016 | Rao | G01S 13/931 342/59 |
| 2016/0364362 A1* | 12/2016 | Akers | G06F 13/364 |
| 2018/0267800 A1* | 9/2018 | Kitchin | G06F 9/30043 |
| 2019/0178983 A1* | 6/2019 | Lin | G01S 13/003 |

* cited by examiner

RADAR SYSTEM AND CONTROL METHOD THEREFOR

CLAIM OF PRIORITY

This application is a 371 United States national phase application of co-pending international patent application No. PCT/CN2019/091576, filed Jun. 17, 20199 which claims the priority of the Chinese patent application filed on Nov. 29, 2018 with the application number 201811445465.2 and the invention titled "Radar System and Control Method Therefor", the entire contents of which are incorporated by reference in this application.

FIELD OF THE INVENTION

The present invention relates to the field of radio communication, and more specifically, to a radar system and processing method thereof.

DESCRIPTION OF THE PRIOR ART

Existing radar systems generally include a processor and multiple radio frequency chips (or radio frequency modules) arranged in an array. In order to achieve synchronization of each radio frequency chip, the processor needs to provide a corresponding synchronization signal sync to each radio frequency chip. Each radio frequency chip obtains the received signal through the corresponding antenna, and converts the received signal into an intermediate frequency signal IF according to the synchronization signal sync. The processor performs signal processing on the intermediate frequency signal IF from each radio frequency chip, so as to parse and obtain the final data provided by the received signal.

SUMMARY OF THE INVENTION

The present invention provides a radar system and a radar system control method. By distributing at least part of signal processing to each radar unit, the radar system and the control method thereof reduce the difficulty of development and the cost of implementation, enjoy the advantage of good scalability, and make it easier to integrate more RF channels in the radar system so as to build a large-scale radar system, thereby improving the detection range and the accuracy and resolution of the detection angle.

According to one aspect of the present invention, there is provided a radar system comprising a plurality of radar units, each of which comprises one or more RF channels configured to receive a reflected signal and then generate an analog input signal according to the reflected signal and a processing module connected with the one or more RF channels and configured to sample the analog input signal to obtain a digital signal and perform the first digital signal processing on the digital signal to obtain intermediate data. In one embodiment, when the plurality of radar units work jointly, a designated radar unit performs the second digital signal processing on the plurality of intermediate data provided by the plurality of radar units, thereby obtaining result data of the radar system, thereby obtaining result data of the radar system.

According to another aspect of the present invention, there is provided a control method for the radar system, the radar system comprising a plurality of radar units. The control method includes: (a) generating, by each of the plurality of radar units respectively, an analog input signal based on the received signal, and sampling, by each of the plurality of radar units respectively, the analog input signal to obtain a corresponding digital signal; (b) performing, by each of the plurality of radar units respectively, the first digital signal processing on the sampled digital signal, thereby obtaining corresponding intermediate data; and (c) performing, by the designated radar unit, when the plurality of radar units work jointly, the second digital signal processing on the plurality of intermediate data provided by the plurality of radar units, thereby obtaining result data of the radar system.

In the embodiments of the present invention, the radar system and the control method thereof replace the processor that processes data in a unified manner in the prior art, by distributing part or all of the signal processing among the radar units. Therefore, the requirement for the processing capability of each radar unit is relatively low, making the radar system have better scalability and reducing the implementation cost of the radar system. Accordingly, it is easy to increase the number of RF channels to build a large-scale radar system, which improves the detection range and the accuracy and resolution of the detection angle. Meanwhile, the structure of each radar unit is similar or identical, so the design time and the complexity of the system are greatly reduced when designing or extending the radar system. With no need to redesign different chips or modules separately, the radar system and the control method thereof boost the efficiency of design and reduces the cost and difficulty of design.

In an alternative embodiment, each radar unit may be implemented in group or independently through an SoC chip, thereby enhancing the on-chip integration of the radar system.

In some optional embodiments, the radar system and the control method thereof are of a simple structure, employing a transmission unit with a bus architecture to realize synchronization and data transmission among the radar units. In other embodiments, the radar system and the control method thereof employ a transmission unit with a master-slave structure, and divide signal processing into multiple parts, each of which can be performed in a single radar unit or executed separately in a plurality of radar units, thereby realizing the foregoing technical effects, as well as lowering the requirements for the processing capability of each radar unit. The radar system is more highly flexible with no need to configure a bus with strong data carrying capacity and transmission capability, further reducing the difficulty in extension and the cost of the radar system, thereby making it easier to improve the detection range and the accuracy and resolution of detection angle.

BRIEF DESCRIPTION OF THE DRAWINGS

By following description of embodiments with reference to the accompanying drawings of the present invention, the foregoing and other objects, features and advantages of the present invention will become apparent.

DETAILED DESCRIPTION

Figure 1:
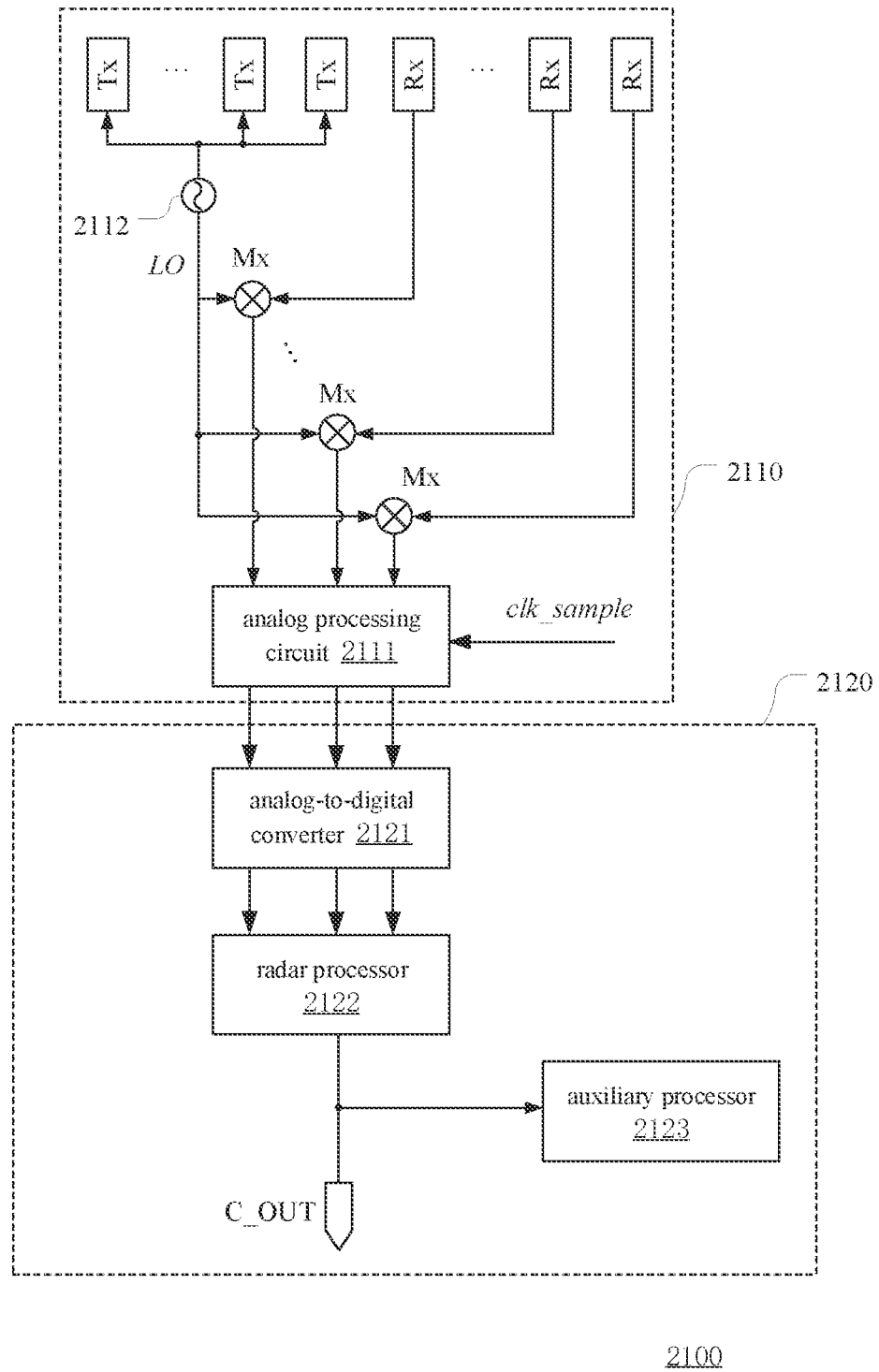
FIG. 1 shows a structural schematic diagram of a plurality of radar units in a radar system in an alternative embodiment of the present invention.

Various embodiments of the present invention will be described in more detail with reference to figures of the embodiments. In the figures, the same elements are referenced by same or similar identical reference markings. For clarity, elements in the figures are not drawn to scale. Additionally, some well-known parts may not be illustrated in the drawings.

FIG. 1 shows a structural schematic diagram of a plurality of radar units in a radar system in an alternative embodiment of the present invention.

As shown in FIG. 1, the radar system of the first embodiment of the present invention includes a plurality of radar units 2100 that may be arranged to be an array.

Each radar unit 2100 includes a front-end module 2110, a processing module 2120, and one or more antennas (labeled with number 2130 in FIGS. 3 and 4) configured to be a receiving antenna and/or a transmitting antenna for receiving signals and/or emitting signals.

The front-end module 2110 converts the signal received via each antenna to a corresponding analog input signal according to a local oscillator LO signal, so that the front-end module 2110 and the one or more antennas (which may form an antenna array) form one or more RF channels of the radar unit 2100. In one embodiment, the transmitting antenna may emit a signal based on the same LO signal. As shown in FIG. 1, the front-end module 2110 includes a plurality of antennas providing Tx channels, a plurality of antennas providing Rx channels, a plurality of mixers Mx, an analog processing circuit 2111, and a local oscillator signal generator 2112. In the process of receiving signals, each mixer MX respectively mixes the signal received by a corresponding Rx channel with the LO signal to obtain a primary analog signal. Each primary analog signal is converted to an analog input signal in the analog processing circuit 2111. In some embodiments, the LO signal generated by the local oscillator signal generator 2112 is shared by all Tx channels and Rx channels.

Connected with each RF channel, the processing module 2120 is configured to obtain a digital signal by sampling the analog input signal and obtain intermediate data by performing the first digital signal processing on the digital signal. Specifically, the processing module 2120 includes an analog-to-digital converter 2121 and a radar processor 2122. The analog-to-digital converter 2121 is configured to obtain a corresponding digital signal by sampling the analog input signal according to a sampling clock (clk_sample) signal; The radar processor 2122 includes 1st to Mth sub-processing units and storage units for storing intermediate data and/or result data, where the 1st to Kth sub-processing units are used for implementing the first data processing, and the k+1th to Mth sub-processing units are used for implementing the second data processing, where M is a natural number greater than or equal to 2 and K is a natural number greater than or equal to 1 and less than M.

The radar unit 2100 provides intermediate data for external circuits (for example, any other radar unit or other external circuits) through a corresponding port C_OUT.

Optionally, all RF channels and the processing module 2120 in each radar unit are integrated into the same SoC chip.

In some embodiments, the processing module 2120 of each radar unit further includes an auxiliary processor 2123. The auxiliary processor 2123 may further process the output data provided by the radar processor 2122 and output the intermediate data then obtained through the corresponding port C_OUT.

In this embodiment, the signals received by each radar unit in the radar system will eventually be converted to result data of the radar system through the first and second digital signal processing. Each radar unit can work alone or jointly. When radar units work jointly, a designated radar unit performs the second digital signal processing on the intermediate data provided by all radar units to obtain result data of the radar system; When radar units work alone, each of the radar units working independently constitutes a radar system, where the processing module of the radar unit continues to perform the second digital signal processing on the intermediate data obtained, thereby obtaining the result data of the radar unit.

In embodiments of the present invention, a plurality of radar units in the radar system may jointly process the received data, thus obtaining result data, such as the range, velocity and angle information of the target, or the point cloud radar image based on the result data. This is further explained as an example below.

Figure 2:
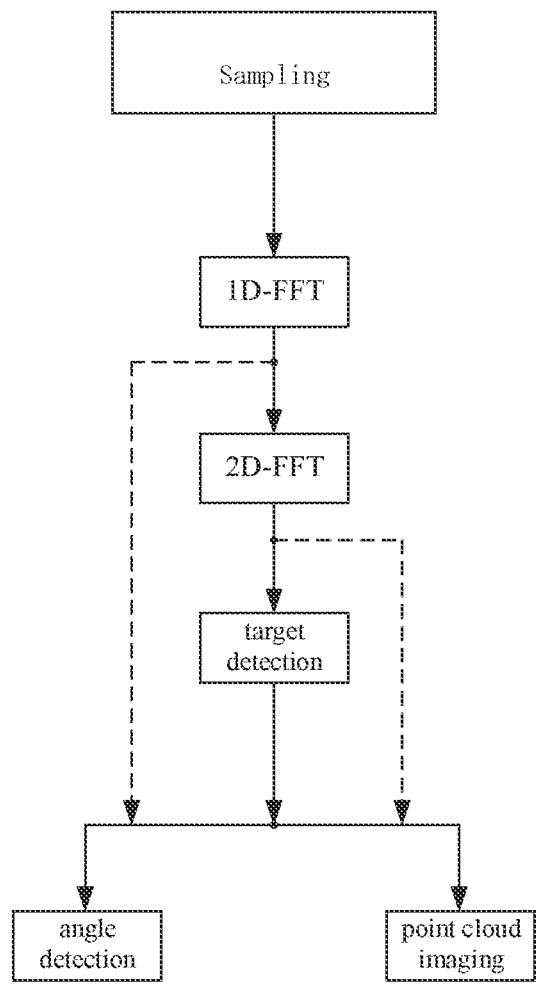
FIG. 2 shows a flowchart of data processing by a processing module in an alternative embodiment of the present invention to perform a data processing process.

FIG. 2 is a flowchart of data processing by a processing module according to a first embodiment of the present invention.

As shown in FIG. 2, in this embodiment, the result data includes, for example, the result data obtained after the angle detection and/or the result data obtained after the point cloud imaging. For example, the 1st to Mth sub-processing units in the radar processor 2122 respectively perform at least part of processes of Fourier transform, target detection, angle detection and point cloud imaging, where the Fourier transform may include the first-dimensional fast Fourier transform (1D-FFT) and the second-dimensional fast Fourier transform (2D-FFT).

As shown in FIG. 2, when the radar unit works alone, the analog-to-digital converter in the processing module first samples an analog input signal to obtain a digital signal, and then based on the digital signal, the radar processor carries out Fourier transform (1D-FFT and 2D-FFT), target detection, etc., thereby obtaining final result. In this case, the radar unit operates as a radar system alone, the relevant flow of which is illustrated by the solid arrows in FIG. 2.

When the radar unit jointly works with other radar units or circuits, as shown by the dotted lines in FIG. 2, the radar processor may transmit the results of the 1D-FFT, 2D-FFT and target detection, functioned as intermediate data, to any other radar unit or other circuits based on the digital signal obtained after the analog-to-digital converter of the radar unit samples an analog input signal, thereby in principle realizing data exchange between the radar unit and external circuits at any data processing stage. The radar unit or other circuits receiving the intermediate data continues to transmit intermediate data to other circuits or to perform the second data processing on the intermediate data (for example, angle detection and point cloud imaging shown in FIG. 2). In this case, the radar unit realizes a distributed radar processing system with any other radar unit and/or other circuits.

In an alternative embodiment, the radar system disclosed in the present invention can also distribute the data to the radar units for further processing after part of the sub-steps have been executed in one designated radar unit, and then obtain result data by processing in one designated radar unit again the data gathered from the radar units. That is, the data processing processes for the radar system may include at least one centralized data processing (executed in a designated radar unit) and at least one distributed data processing (executed separately in each radar unit).

In one preferred embodiment, the amount of data calculated in each centralized processing is smaller than that in the distributed processing, thus avoiding being burdensome on the data transmission capability of each radar unit and the data carrying capacity of the designated radar unit for centralized processing.

The data processing process in FIG. 2 will be illustrated as an example. Because the data throughput before target detection and the required storage space are huge, it is hard to meet the real-time requirements for the radar system. In one preferred embodiment, each radar unit provides intermediate data after completing the data processing of target detection, ensuring that the amount of intermediate data provided by each radar unit and the required storage space are limited to a relatively small range, and therefore, the performance of the radar system is guaranteed. Further, what needs to be exchanged among the radar units are only the target addresses obtained after target detection and the corresponding 2D-FFT information; subsequently, a designated radar unit performs the further data processing, such as angle detection, on the aggregated target addresses and the corresponding 2D-FFT information provided by all radar units, thereby obtaining result data in the designated radar unit.

Figure 3:
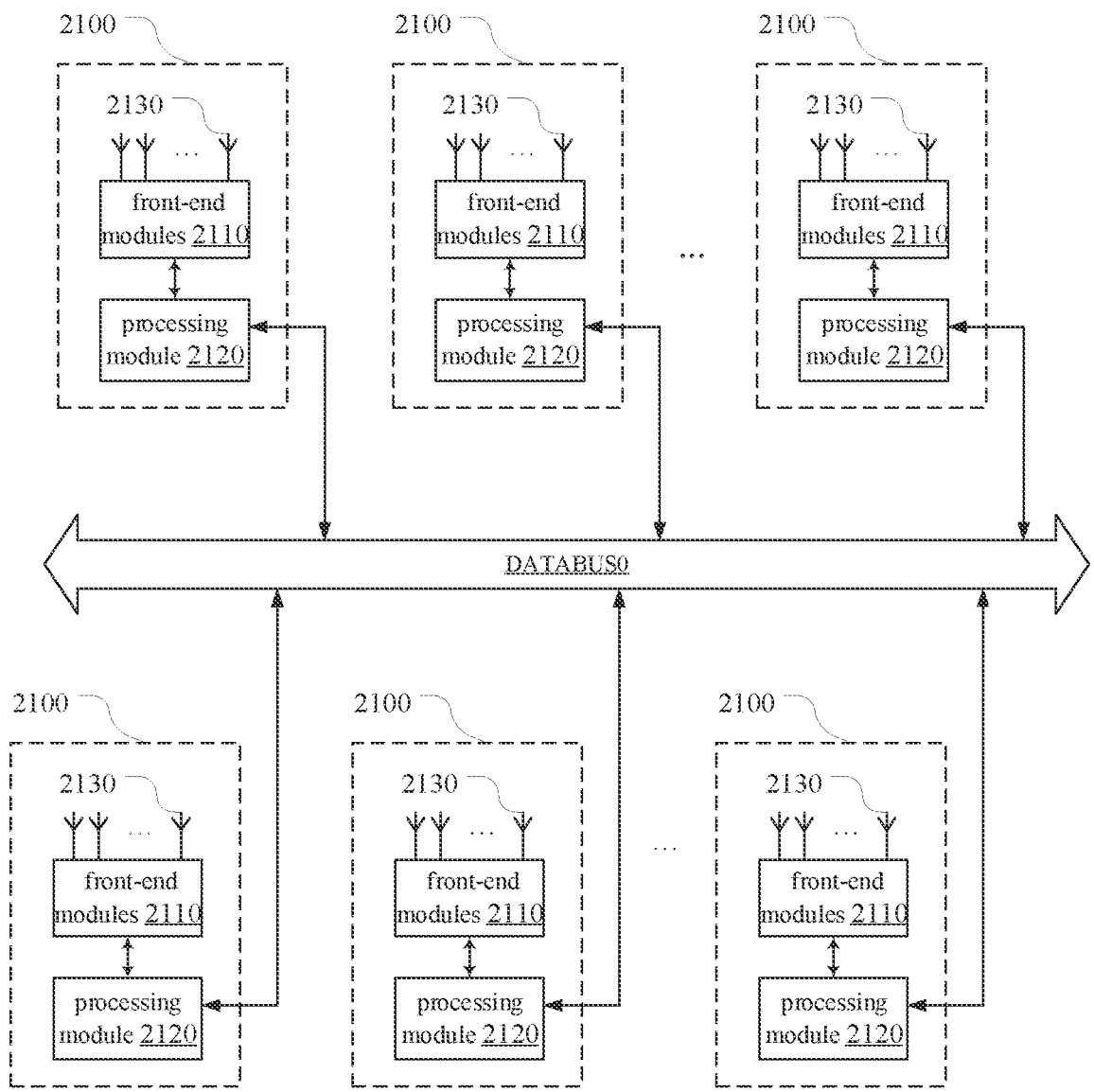
FIG. 3 shows a schematic block diagram of a radar system according to an alternative embodiment of the present invention.

FIG. 3 is a schematic block diagram of a radar system according to a second embodiment of the present invention.

In the second embodiment of the present invention, as shown in FIG. 3, the radar system 2000 employs a bus structure DATABUS0 to realize synchronization and data transmission and exchange among the radar units 2100. The internal structure of each radar unit 2100 is the same as that of the radar unit shown in FIG. 1, details of which will not be repeated herein.

Optionally, the bus structure arranged on the circuit board where the radar system is located is distributed in multiple SoC chips, and the radar units are integrated into the corresponding SoC chips in group or independently. In one preferred embodiment, the multiple SoC chips may be distributed on both sides of the bus structure. In an alternative embodiment, the bus structure may also be directly arranged in the chip encapsulation structure.

In the foregoing embodiment, the radar system replaces the processor that processes data in a unified manner in the prior art with the processing module separately arranged in each radar unit. And the radar system employs a bus structure connected with all radar units to realize clock synchronization, data synchronization and data exchange. Therefore, the requirement for the processing capability of the processing module is relatively low, making the radar system have better scalability and reducing the implementation cost of the radar system. Accordingly, it is easy to increase the number of radio frequency channels to build a large-scale radar system, which improves the detection range and the accuracy and resolution of the detection angle; meanwhile, the structure of radar units are similar or identical, so the design time and the complexity of the system are greatly reduced when designing or extending the radar system. With no need to redesign different chips or modules separately, the radar system and the control method thereof boost the efficiency of design and reduces the cost and difficulty of design.

The radar system of the foregoing embodiment employs a bus structure. However, with the RF channels increasing, the bus structure needs higher data carrying capacity and data transmission rate to support data sharing among the radar units. Meanwhile, a very strict synchronization mechanism is also needed among the radar units. For this reason, the present invention provides a radar system in the second embodiment on the basis of the radar system shown in FIG. 1, in order to reduce difficulty in designing transmission unit and synchronization mechanism.

Figure 4:
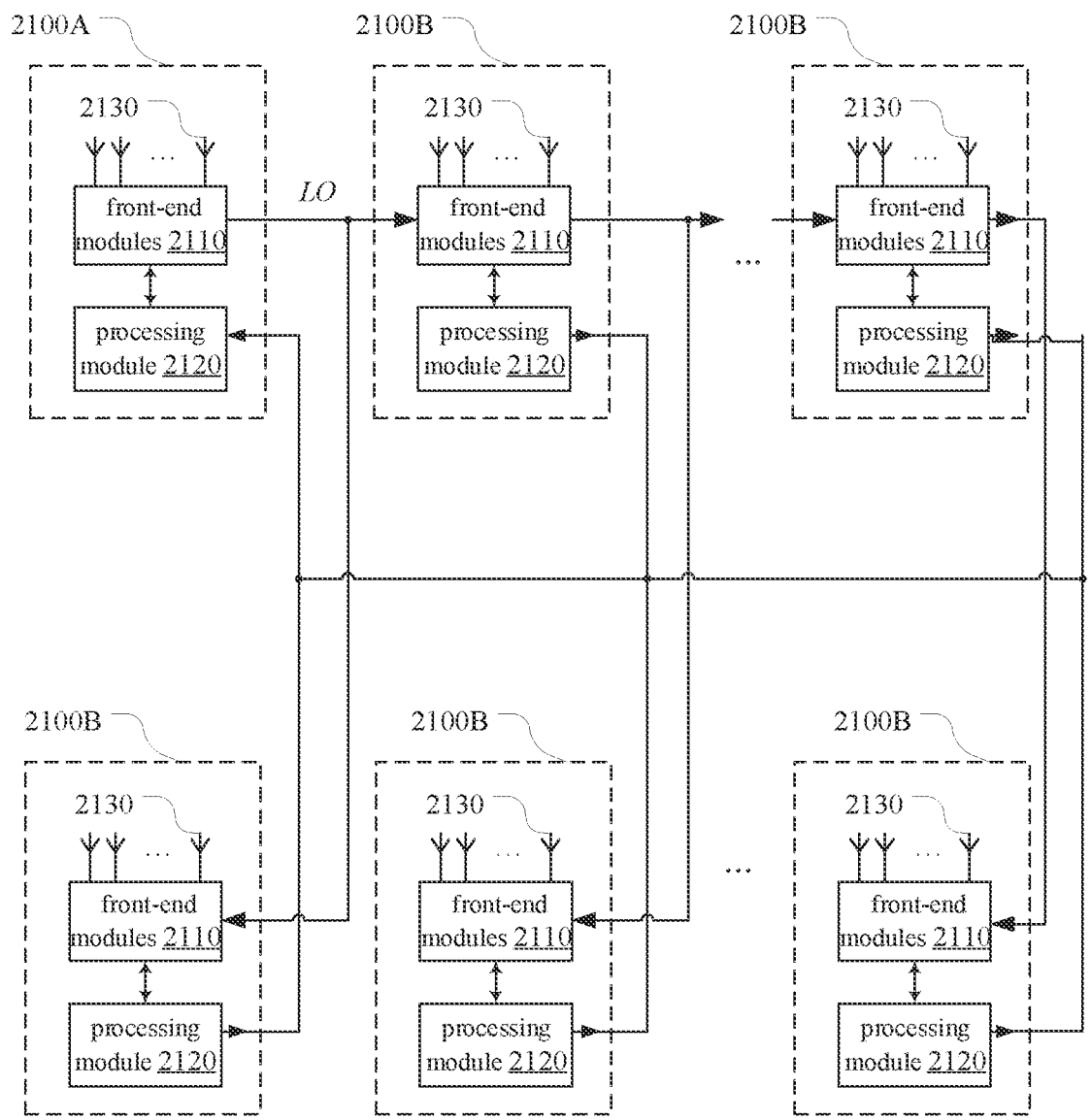
FIG. 4 shows a schematic block diagram of a radar system according to another alternative embodiment of the present invention.

FIG. 4 is a schematic block diagram of a radar system according to a third embodiment of the present invention.

In the third embodiment of the present invention, as shown in FIG. 4, the radar system also includes a plurality of radar units. The internal structure of each radar unit is the same as that of the radar unit shown in FIG. 1, details of which will not be repeated herein.

Different from the radar system in the second embodiment, in the third embodiment, a plurality of radar units include a master radar unit 2100A and a plurality of slave radar units 2100B, thus forming a master-slave structure which differs from a bus structure. In this embodiment, the intermediate data generated by the processing module of each radar unit will be further processed by the second digital processing in a designated radar unit (the master radar unit or one of the plurality of the slave radar units), so that final result data can be obtained through the designated radar unit.

Specifically, the master radar unit 2100A can be cascaded with the slave radar units 2100B in sequence, details of which will be described as an example below.

When a plurality of radar units work jointly, a synchronization mechanism is needed in order to synchronize the master radar unit 2100A and the slave radar units 2100B. The synchronization system mainly includes synchronization in three aspects. Specifically, the local oscillator LO signals, the clk_sample signals of the analog-to-digital converter and all the processors inside the radar units should be synchronized. In one embodiment, the master radar unit 2100A generates and provides LO signals and clk_sample signals for all the slave radar units 2100B. Based on the same clk sample signal, the processing module of each radar unit samples a corresponding analog input signal. Each front-end module in the front-end transceiver link shares the same LO signal (For example, the main LO signal is provided directly or indirectly by the Phase Locking Loop (PLL) structure in the master radar unit 2100A for the front-end modules 2110 of the slave radar units 2100B), thereby synchronizing all radar units.

Figure 5:
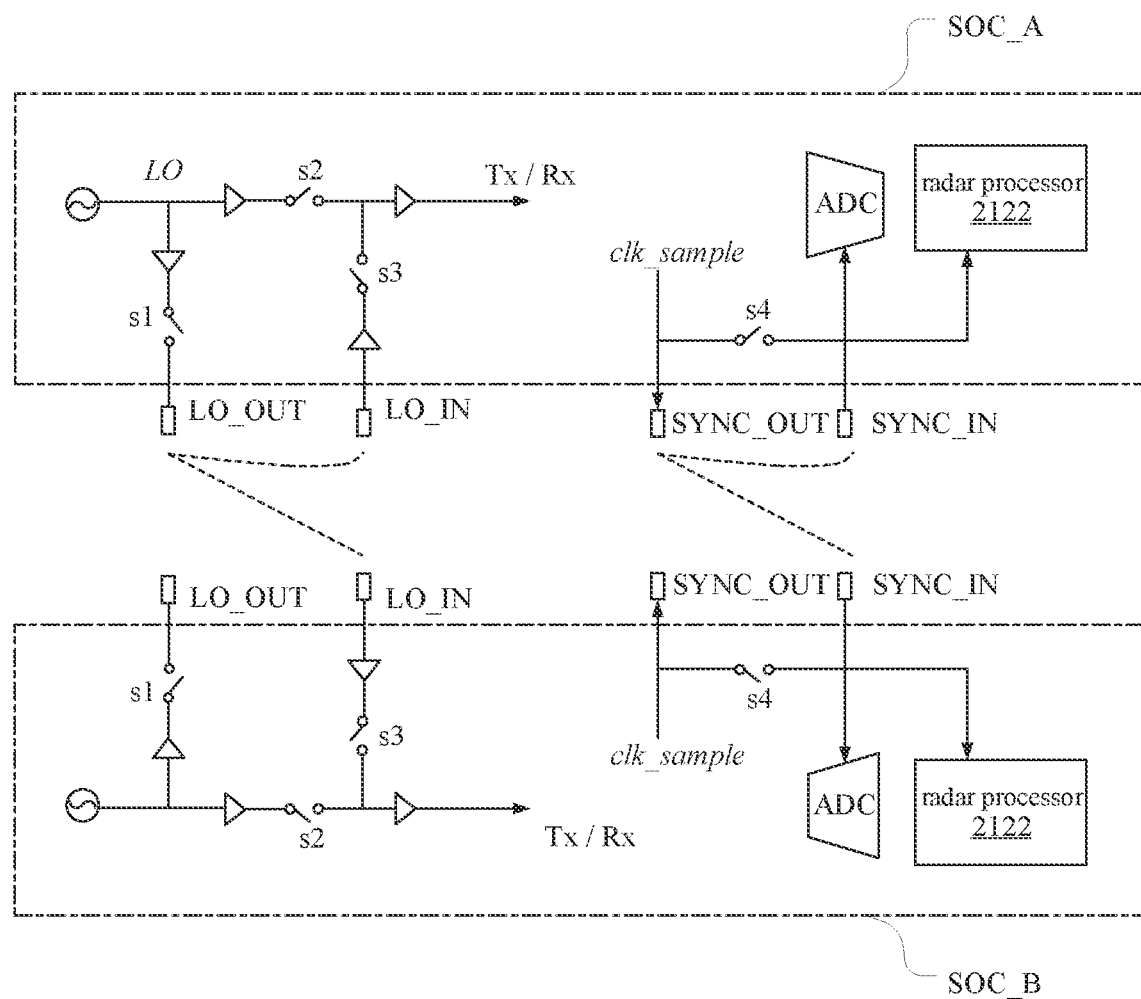
FIG. 5 shows a partial schematic diagram of the synchronization mechanism of the radar system.

Based on FIG. 5, the synchronization mechanism of the radar system is described in detail below. It should be noted that only part of each radar unit (for example, a LO signal generator, a plurality of buffers or inverters, a plurality of switches, Tx channels, Rx channels, analog-to-digital converter (ADC), and radar processor, etc.) is shown in FIG. 5. In order to simplify the description, a radar system comprising two radar units is described as an example to illustrate the synchronization and data exchange among the radar units, but is not intended to limit the present invention. Persons skilled in the art may extend the radar system in the following embodiment to a radar system comprising more than two radar units as required.

As shown in FIG. 5, the master radar unit 2100A (for example, implemented by the first chip SoC_A) and the slave radar unit 2100B (for example, implemented by the second chip SoC_B) respectively have ports of LO signals, namely LO_OUT and LO_IN, and ports of clk_sample signals, namely SYNC_OUT and SYNC_IN.

When the radar unit works alone (For example, only the master radar unit operates in the radar system.), as shown in FIG. 5, in the master radar unit 2100A the switches s2 and s4 are closed, s1 and s3 are open, and meanwhile the ports of LO_OUT, LO_IN, SYNC_IN and SYNC_OUT (or the corresponding internal signals) are all disconnected (invalid state); the slave radar unit 2100B is off.

When the master radar unit and the slave radar units work jointly, in the master radar unit 2100A the switch s2 and s4 are open and s1 and s3 are closed. In the slave radar unit 2100B the switches s1', s2', s4' are open and the switch s3' is closed; meanwhile, the port LO_OUT of the master radar unit 2100A provides a LO signal for the port LO_IN of the master radar unit 2100A and the port LO_IN of the slave radar units 2100B. And the port SYNC_OUT of the master radar unit 2100A provides a clk_sample signal for the port SYNC_IN of the master radar unit and the port SYNC_IN of the slave radar units 2100B. Therefore, the LO signal synchronization and the clk_sample signal synchronization can be realized among the radar units. When the master radar unit and the slave radar units work jointly, the connection relationship between them is shown by the dotted line in FIG. 6.

Figure 6:
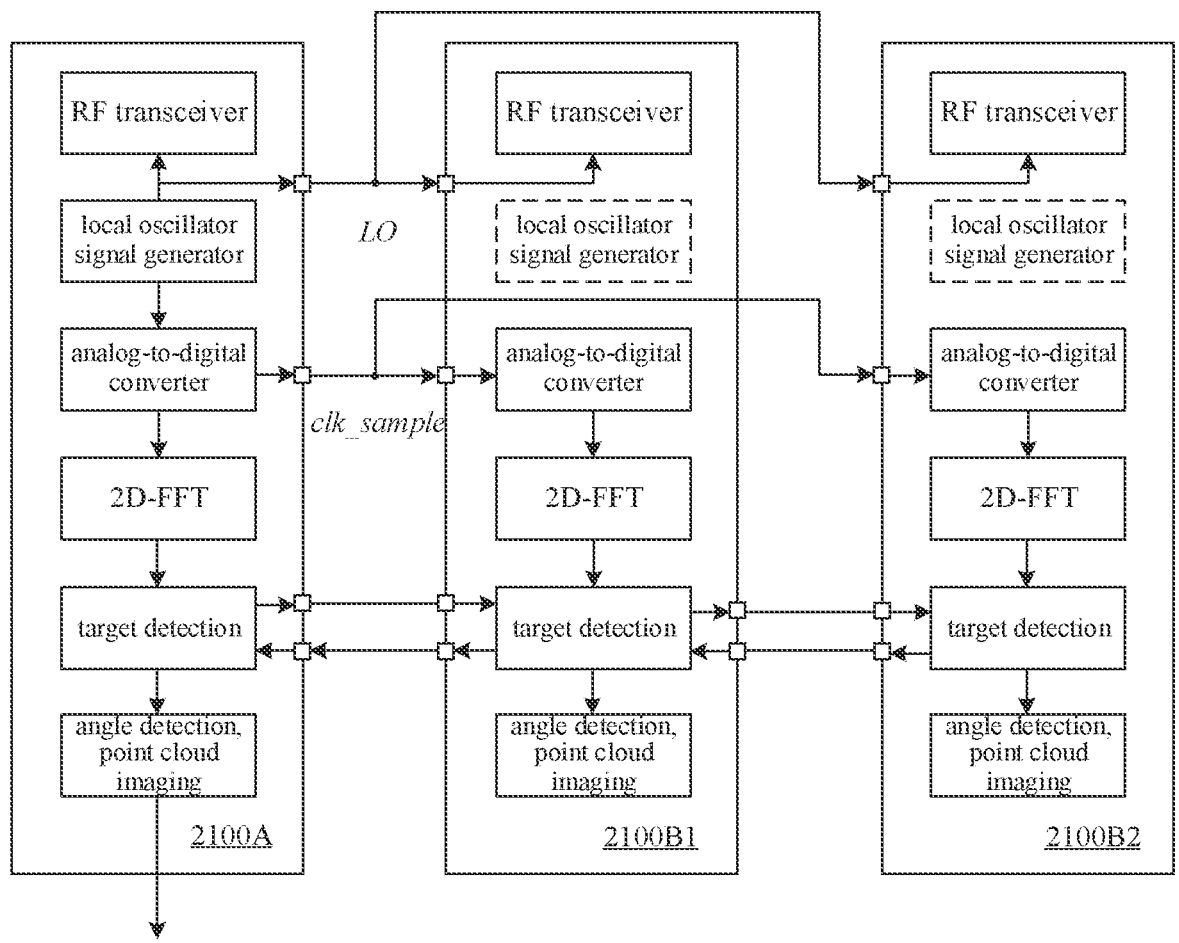
FIG. 6 shows a schematic block diagram of a first possible implementation structure of the radar system illustrated in FIG. 5.

FIG. 6 is a schematic block diagram of a first implementation structure of the radar system illustrated in FIG. 5. The radar system only shows three cascaded radar units in the figure, but is not intended to limit the embodiments of the present invention. Persons skilled in the art may accordingly design a radar system comprising two or more radar units. Meanwhile, it should be noted that some modules in the radar unit are not shown.

As shown in FIG. 6, the master radar unit 2100A transmits the target addresses obtained after its own target detection to the slave radar unit 2100B1. The first stage combined target addresses are generated from the target addresses obtained by the slave radar unit 2100B1 after its own target detection and the target address provided by the master radar unit 2100A (The first stage combined target addresses may include the target addresses provided by the master radar unit and/or the slave radar unit.), which is transmitted to the slave radar unit 2100B2; likewise, the second stage combined target addresses are generated from the target addresses obtained by the slave radar unit 2100B2 after its own target detection and the first stage combined target addresses provided by the slave radar unit 2100B1 (The second stage combined target addresses may include the target addresses provided by the slave radar unit 2100B2 and/or the first stage combined target addresses provided by the slave radar unit 2100B1), thereby generating final target addresses.

Subsequently, the final target addresses and the corresponding 2D-FFT information are transmitted back from the slave radar unit 2100B2 to the slave radar unit 2100B1; according to the final target addresses, the slave radar unit 2100B1 transmits back the corresponding 2D-FFT information and the 2D-FFT information provided by the slave radar unit 2100B2 to the master radar unit 2100A; The master radar unit 2100A provides for the radar processor in the master radar unit the corresponding 2D-FFT information according to the final target addresses and the 2D-FFT information transmitted from the slave radar units 2100B1 and 2100B2, which enables the angle detection unit or the point cloud imaging processing unit in the radar processor to further process the 2D-FFT information provided by each radar unit and generate result data of the radar system.

Figure 7:
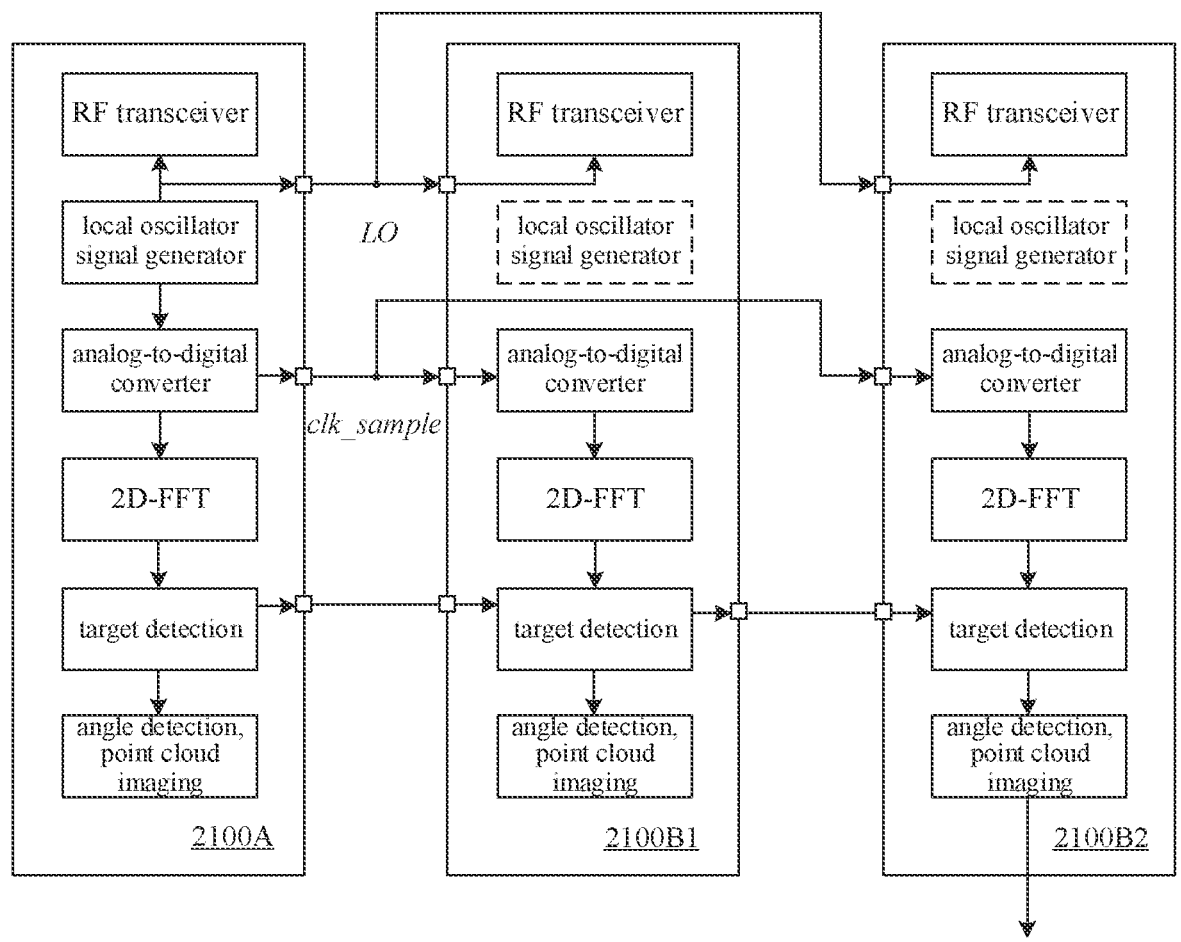
FIG. 7 shows a schematic block diagram of a second implementation structure of the radar system illustrated in FIG. 5.

FIG. 7 is a schematic block diagram of a second implementation structure of the radar system illustrated in FIG. 5. Similarly, the radar system only shows three cascaded radar units in the figure, but is not intended to limit the embodiments of the present invention. Persons skilled in the art may accordingly design a radar system comprising two or more radar units. Meanwhile, it should be noted that some modules in each radar unit are not shown.

As shown in FIG. 7, the master radar unit 2100A transmits the target addresses obtained after its own target detection and the corresponding 2D-FFT information to the slave radar unit 2100B1. The slave radar unit 2100B1 obtains the target addresses after its own target detection and the corresponding information, and then generate the first stage combined target addresses according to the target addresses obtained by itself and the target addresses of the master radar unit 2100A (The first stage combined target addresses may include the target addresses provided by the master radar unit and/or the slave radar unit). Then, the first stage combined target addresses and the corresponding 2D-FFT information respectively provided by the master radar unit 2100A and the slave radar unit 2100B1 are transmitted to the slave radar unit 2100B2; likewise, the slave radar unit 2100B2 obtains the target addresses and the corresponding information after its own target detection, and then generate the second stage combined target addresses according to the target addresses obtained by itself and the first combined target addresses provided by the slave radar unit 2100B1 (The second stage combined target addresses may include the target addresses provided by the slave radar unit 2100B2 and/or the first stage combined target addresses provided by the slave radar unit 2100B1). Subsequently, the slave radar unit 2100B2 obtains final target addresses according to the second stage combined target addresses. And according to the final target addresses, the slave radar unit 2100B2 transmits back the 2D-FFT information provided by the slave radar units 2100B1, 2100B2 and the master radar unit 2100A to the radar processor in the slave radar unit 2100B2, which enables the angle detection unit or the point cloud imaging processing unit in the radar processor to further process the 2D-FFT information provided by each radar unit and then generate result data of the radar system.

Figure 8:
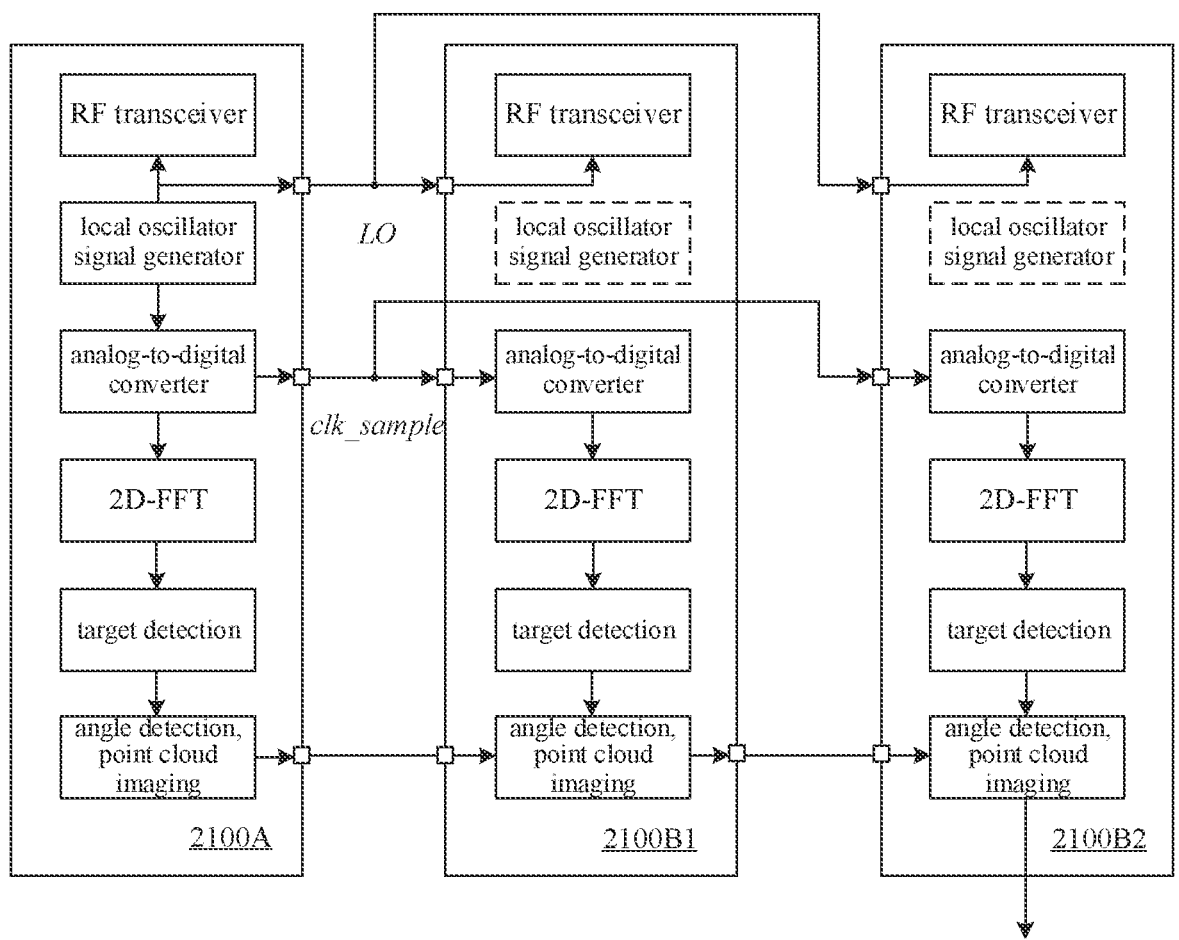
FIG. 8 shows a schematic block diagram of a third implementation structure of the radar system illustrated in FIG. 5.

FIG. 8 is a schematic block diagram of a third implementation structure of the radar system illustrated in FIG. 5. Similarly, the radar system only shows three cascaded radar units in the figure, but is not intended to limit the embodiments of the present invention. Persons skilled in the art may accordingly design a radar system comprising two or more radar units. Meanwhile, it should be noted that some modules in each radar unit are not shown.

As shown in FIG. 8, the master radar unit 2100A transmits the target addresses obtained after its own target detection and the corresponding 2D-FFT information to the angle detection unit and the point cloud imaging processing unit in the radar processor. The processing units transmit the results of angle detection and the target addresses of the master radar unit to the slave radar unit 2100B1; the slave radar unit B1 generates the first stage combined target addresses according to the target addresses obtained after its own target detection and provided by the master radar unit (The first stage combined target addresses may include the target addresses provided by the master radar unit and/or the slave radar unit.). And the 2D-FFT information corresponding to the first stage combined target addresses is provided for the angle detection and point cloud imaging processing units in the slave radar unit 2100B1. The processing units correspondingly obtain the 2D-FFT information based on the first combined target addresses, and carries out calculations according to the 2D-FFT information and results of the angle detection provided by the master radar unit, thereby obtaining the first stage combined results. Finally, the first stage combined results and the first combined target addresses are collectively transmitted to the slave radar unit 2100B2; the slave radar unit 2100B2 generates the second stage combined target addresses based on the target addresses obtained after its own target detection and the first stage combined target addresses (The second stage combined target addresses may include the target addresses provided by the slave radar unit 2100B2 and/or the first stage combined target addresses provided by the slave radar unit 2100B1). And the 2D-FFT information corresponding to the second combined target addresses is provided for the angle detection and point cloud imaging processing units in the slave radar unit 2100B2. The processing unit obtains corresponding 2D-FFT information according to the second stage combined target addresses, and carries out calculations according to the 2D-FFT information and the first stage combined results provided by the slave radar unit 2100B1, thus generating result data of the radar system.

The data processing in the FIG. 8 is described in detail below.

The angle detection and point cloud imaging are mainly used for calculating the energy distribution spectrum generated by the object at different angles. The peak point of the spectrum corresponds to the direction of the object and the direct output of the spectrum can be used to form point cloud image. Specifically, each reflector has a peak value in the 2D-FFT information of each Rx channel. It is assumed that there are n channels, and in this case, these peaks are respectively recorded as xi, i=1 . . . n. In order to obtain the energy distribution spectrum in different directions, it is necessary to generate the weighting coefficients $\omega_i(\theta)$, i=1 . . . n according to the information contained in the digital signal converted from the received signal, where $\theta$ represents the direction angle, and for example, the range of values may be $-90°$ to $90°$ and the interval of values may be $1°$. The calculation formula for obtaining the energy distribution spectrum $\text{Spectrum}_{BFM}(\theta)$ can be written as follows:

$$\text{Spectrum}_{BFM}(\theta) = \|\Sigma_{i=1}^{n} x_i \omega_i(\theta)\|^2 \quad (1)$$

Since n Rx channels are distributed in different radar units when all the radar units work jointly, each radar unit can only partially provide the peak xi of the part of n peaks. In some embodiments, each radar unit can only obtain partial weighting coefficients $\omega_i(\theta)$ of n weighting coefficients, that is, each radar unit can only obtain partial antenna information.

A radar system containing two radar units is illustrated as an example herein. It is assumed that the first radar unit contains n1 Rx channels and the second radar unit contains n2 Rx channels, where n1 and n2 are non-zero natural numbers and the sum of n1 and n2 is n. In this case, the calculation formula of the energy distribution spectrum $\text{Spectrum}_{BFM}(\theta)$ can be written as follows:

$$\text{Spectrum}_{BFM}(\theta) = \|\Sigma_{i=1}^{n1} x_i \omega_i(\theta) + \Sigma_{i=n1+1}^{n2} x_i \omega_i(\theta)\|^2 \quad (2)$$

As shown in FIG. 8, the first radar unit in a cascading radar system can directly transmit the calculated value of $\Sigma_{i=1}^{n1} x_i \omega_i(\theta)$ to the second radar unit; and after the second radar unit obtains the value of $\Sigma_{i=n1+1}^{n2} x_i \omega_i(\theta)$, what it needs to do is to combine the two values, obtain a modulus and transmit the modulus to the next radar unit. By repeating the process, the result data, i.e. $\text{Spectrum}_{BFM}(\theta)$, is finally obtained in the last radar unit.

In the radar system shown in FIG. 6 and FIG. 7, the maximum data transmission amount among radar units is proportional to the total number of radar units in the radar system. In the radar system shown in FIG. 8, the data transmission amount among radar units remains basically unchanged, and therefore, the scheme can further reduce the information transmission amount among radar units and enhance scalability.

Figure 9:
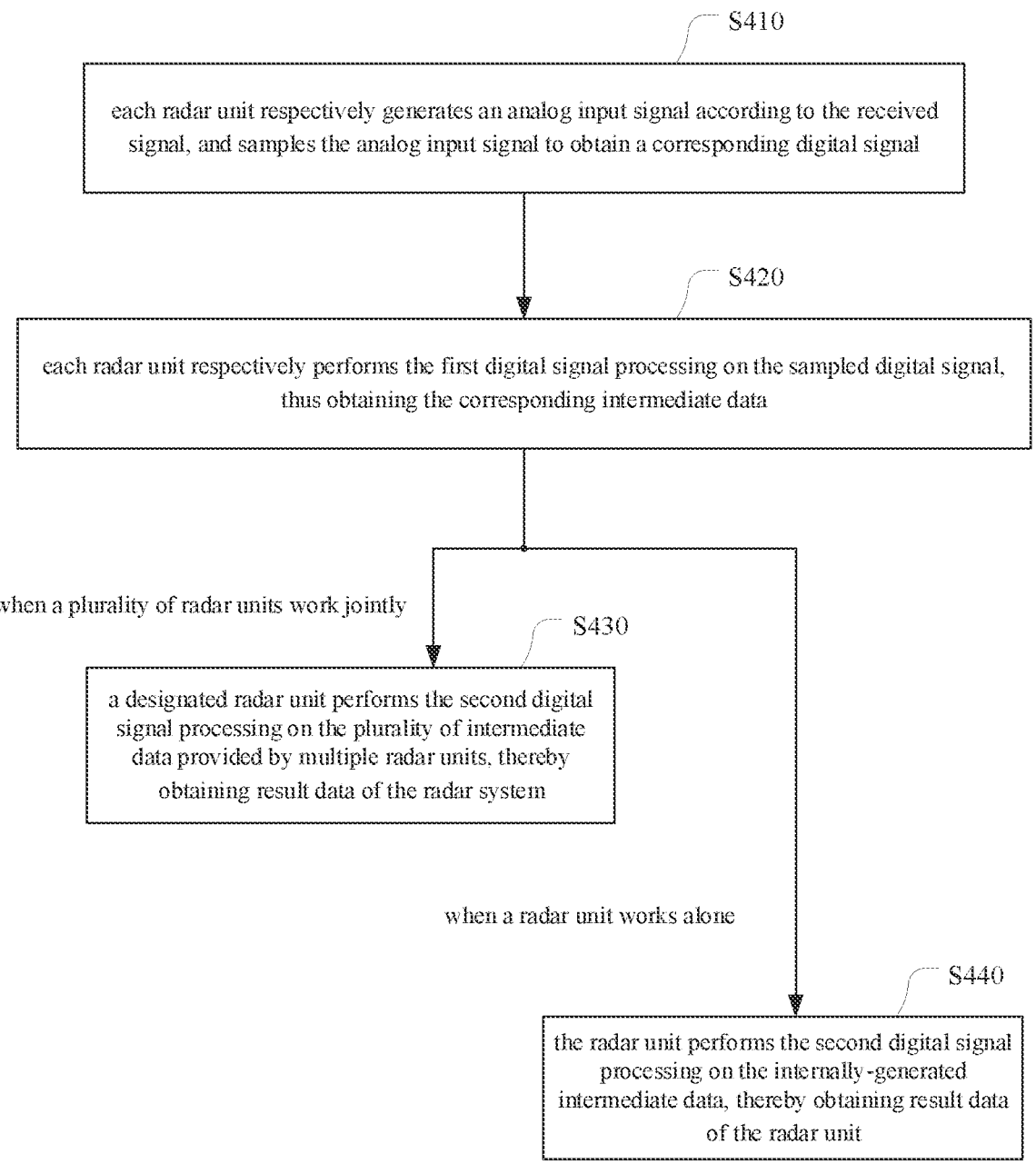
FIG. 9 is a flowchart of a radar system control method in a fourth embodiment of the present invention.

In the third embodiment of the present invention, the radar system employs a transmission unit with a master-slave structure, and divides the signal processing into multiple parts, a corresponding part of which can be executed in a distributed manner in each radar unit or executed in a centralized manner in a designated radar unit, thereby realizing the foregoing technical effects, as well as lowering the requirements for the processing capability of each radar unit. The radar system is more highly flexible with no need to configure a bus with strong data carrying capacity and transmission capability, further reducing the difficulty in the extension and the cost of the radar system, thereby making it easier to improve the detection range and the accuracy and resolution of detection FIG. 9 is a flowchart of a radar system control method in a fourth embodiment of the present invention.

In the fourth embodiment of the present invention, the control method of the radar system includes steps from S410 to S440, where the radar system comprises a plurality of radar units (For example, the radar system is the system described in the foregoing embodiments).

In step S410, each radar unit respectively generates an analog input signal according to the received signal, and samples the analog input signal to obtain a corresponding digital signal. Specifically, each radar unit converts the received signal into the analog input signal according to a local oscillator signal, and samples the analog input signal according to a clock sample signal, so as to obtain a corresponding digital signal. In some embodiments, each radar unit emits a signal according to the same local oscillator signal.

In step S420, each radar unit respectively performs the first digital signal processing on the sampled digital signal, thus obtaining the corresponding intermediate data.

In step S430, when a plurality of radar units work jointly, a designated radar unit performs the second digital signal processing on the plurality of intermediate data provided by multiple radar units, thereby obtaining result data of the radar system.

In step S440, when a radar unit works alone, the radar unit performs the second digital signal processing on the internally-generated intermediate data, thereby obtaining result data of the radar unit.

In an embodiment, each radar unit includes 1st to Mth sub-processing units, in which the 1st to Kth sub-processing units are used for implementing the first data processing, and the k+1th to Mth sub-processing units are used for implementing the second data processing, where M is a natural number greater than or equal to 2 and K is a natural number greater than or equal to 1 and less than M.

The 1st to Mth sub-processing units respectively perform at least part of processes of Fourier transform, target detection, angle detection and point cloud imaging. The first data processing, for example, includes 1D-FFT, 2D-FFT and target detection; the second data processing, for example, includes angle detection and point cloud imaging.

The connection relationship among radar units may be a master-slave structure or a bus structure. The corresponding control method may be referred to the foregoing embodiments, details of which will not be repeated herein.

In the embodiments of the present invention, the radar system and the control method thereof replace the processor that processes data in a unified manner in the prior art, by distributing part or all of the signal processing among the radar units. Therefore, the requirement for the processing capability of each radar unit is relatively low, making the radar system have better scalability and reducing the implementation cost of the radar system. Accordingly, it is easy to increase the number of RF channels to build a large-scale radar system, which improves the detection range and the accuracy and resolution of the detection angle. Meanwhile, the structure of each radar unit is similar or identical, so the design time and the complexity of the system are greatly reduced when designing or extending the radar system. With no need to redesign different chips or modules separately, the radar system and the control method thereof boost the efficiency of design and reduces the cost and difficulty of design.

In one embodiment, each radar unit may be implemented in group or independently through an SoC chip, thereby enhancing the on-chip integration of the radar system.

In some preferred embodiments, the radar system and the control method thereof are of a simple structure, employing a transmission unit with a bus architecture to realize synchronization and data transmission among the radar units. In other embodiments, the radar system and the control method thereof employ a transmission unit with a master-slave structure, and divide the signal processing into multiple parts, each of which can be performed in a single radar unit or executed separately in a plurality of radar units, thereby realizing the foregoing technical effects, as well as lowering the requirements for the processing capability of each radar unit. The radar system is more highly flexible with no need to configure a bus with strong data carrying capacity and transmission capability, further reducing the difficulty in the extension and the cost of the radar system, thereby making it easier to improve the detection range and the accuracy and resolution of detection angle.

It should be noted that in this specification, the terms "comprise", "comprising" and the like are used to refer to comprise in nonexclusive sense, so that any process, approach, article or apparatus relevant to an element, if follows the terms, means that not only the element listed here, but also those elements not listed explicitly, or those elements inherently included by the process, approach, article or apparatus relevant to the element. If there is no explicit limitation, the wording "comprise a/an . . . " does not exclude the fact that other elements can also be included together with the process, approach, article or apparatus relevant to the element.

In accordance with the example embodiment of the present invention described above, the description of embodiments of the present invention are not intended to be exhaustive or limited to embodiments of the invention in the form disclosed. Obviously, according to the above description, there may be many modifications and variations. The embodiments in the present disclosure was chosen and described in order to explain the principles of the invention and as a practical application to enable persons skilled in the art to well utilize the invention in various embodiments and with various modifications, Accordingly, the protection scope of the present disclosure should be defined by attached claims.

The invention claimed is:

1. A radar system comprising a plurality of radar units, wherein each of the radar units comprises:
one or more radio frequency (RF) channels, wherein each of the one or more RF channels is configured to receive a signal and generate an analog input signal according to the received signal, and
a processing module coupled to the one or more RF channels, wherein the processing module is configured to sample the analog input signal to obtain a digital signal and perform a first digital signal processing to the digital signal, thereby obtaining intermediate data, wherein the first digital signal processing includes a first-dimensional fast Fourier transform (1D-FFT), a second-dimensional fast Fourier transform (2D-FFT), and target detection,
wherein when the plurality of radar units work jointly, a designated radar unit among the plurality of radar units performs a second digital signal processing to a combination of the intermediate data provided by each of the plurality of radar units, thereby obtaining result data of the radar system,
wherein the second digital signal processing is different from the first digital signal processing and includes angle detection, and
wherein each of the plurality of radar units provides the respective intermediate data after finishing the respective target detection, only target address and information of the corresponding 2D-FFT acquired after the respective target detection are exchanged among the plurality of radar units, and the angle detection is performed only in the designated radar unit based on a combination of the target address and information of the corresponding 2D-FFT collected from all of the plurality of radar units.

2. The radar system of claim 1, wherein when each of the radar units works alone, the respective processing module in each of the radar units performs the second digital signal processing otherwise performed by the designated radar unit to the respective intermediate data, thereby obtaining the result data of the respective radar unit.

3. The radar system of claim 1, wherein in each of the radar units, the one or more RF channels comprises:
one or more receiving antennas configured to obtain the signal; and
a front-end module coupled to the one or more receiving antennas and configured to convert the signal to the analog input signal according to a local oscillator (LO) signal;
and the processing module comprising:
an analog-to-digital converter (ADC), configured to obtain the digital signal by sampling the analog input signal according to a sampling clock signal; and
a radar processor including 1st to Mth sub-processing units and storage units, the storage units being configured to store at least one of the intermediate data and the result data, the 1st to Kth sub-processing units being used for implementing the first data processing, the k+1th to Mth sub-processing units being used for implementing the second data processing, wherein M is a natural number greater than or equal to 2 and K is a natural number greater than or equal to 1 and less than M.

4. The radar system of claim 3, wherein the one or more RF channels further comprises:
one or more transmitting antennas configured to emit a transmitting signal according to the LO signal.

5. The radar system of claim 3, wherein the 1st to Mth sub-processing units respectively perform at least part of processes of the following data processing: Fourier transform, target detection, angle detection, and point cloud imaging.

6. The radar system of claim 3, wherein the plurality of radar units comprise a master radar unit and a plurality of slave radar units, and wherein when the plurality of radar units work jointly, the master radar unit generates and transmits the LO signal and the sampling clock signal to the plurality of slave radar units.

7. The radar system of claim 6, wherein the master radar unit is cascaded with the plurality of slave radar units in sequence.

8. The radar system of claim 7, wherein:
each of the radar units that is not a last one in sequence provides for a next radar unit in sequence addresses corresponding to the intermediate data of the current radar unit, or the addresses combined with addresses provided by a former radar unit in sequence, thereby obtaining final addresses in the last radar unit; and
each of the slave radar units transmits the respective intermediate data in a direct manner or through a former slave radar unit in sequence to the master radar unit, so that the master radar unit, as the designated radar unit, generates the result data.

9. The radar system of claim 7, wherein:
each of the radar units that is not a last one in sequence provides for a next radar unit in sequence addresses corresponding to the intermediate data of the current radar unit, or the addresses combined with addresses provided by a former radar unit in sequence, and transmits the intermediate data of the current radar unit and all the former radar units to the next radar unit; and
the last slave radar unit in sequence, as the designated radar unit, generates the result data according to the addresses provided by the former radar unit right before the last slave radar unit and all the intermediate data provided by all the former radar units in sequence.

10. The radar system of claim 7, wherein:
each of the radar units that is not a last one in sequence provides for a next radar unit in sequence the intermediate data of the current radar unit, or the data combined with the intermediate data provided by a former radar unit in sequence; and
the last slave radar unit in sequence, as the designated radar unit, generates the result data according to the data provided by the former radar unit.

11. The radar system of claim 1, wherein each of the radar units is implemented in an individual SoC chip.

12. The radar system of claim 1, wherein each of the radar units realizes synchronization and data exchange through a bus structure.

13. The radar system of claim 12, wherein the bus structure is arranged on a circuit board or in a chip encapsulation structure.

14. The radar system of claim 1, wherein the plurality of radar units are arranged as an array.

15. The radar system of claim 1, wherein the plurality of radar units includes at least first, second, and third radar units, and wherein when the plurality of radar units work jointly, the target address and the information of the corresponding 2D-FFT acquired after the respective target detection performed in the first radar unit are delivered to the second radar unit, and the second radar unit is configured to create a combination of the target address and the information of the corresponding 2D-FFT acquired after the respective target detection performed in the second radar unit together with what is delivered from the first radar unit and further deliver the combination to the third radar unit.

16. A control method for a radar system that includes a plurality of radar units, comprising:
generating, by each of the radar units respectively, an analog input signal based on a received signal;
generating, by each of the radar units respectively, a digital signal by sampling the analog input signal;
performing, by each of the radar units respectively, a first digital signal processing to the digital signal, thereby obtaining intermediate data, wherein the first digital signal processing includes a first-dimensional fast Fourier transform (1D-FFT), a second-dimensional fast Fourier transform (2D-FFT), and target detection; and
performing, by a designated radar unit among the plurality of radar units, when the plurality of radar units work jointly, a second digital signal processing to a combination of the intermediate data provided by each of the plurality of radar units, thereby obtaining result data of the radar system,
wherein the second digital signal processing is different from the first digital signal processing and includes angle detection, and
wherein each of the plurality of radar units provides the respective intermediate data after finishing the respective target detection, only target address and information of the corresponding 2D-FFT acquired after the respective target detection are exchanged among the plurality of radar units, and the angle detection is performed only in the designated radar unit based on a combination of the target address and information of the corresponding 2D-FFT collected from all of the plurality of radar units.

17. The control method of claim 16, further comprising:
performing, when each of the radar units works alone, by each of the radar units respectively, the second digital signal processing otherwise performed by the designated radar unit to the intermediate data, thereby obtaining the result data of the radar unit.

18. The control method of claim 16, wherein each of the radar units respectively generates the analog input signal based on the received signal, and samples the analog input signal to obtain the corresponding digital signal, where steps in operations of each of the radar units include:
converting the received signal to the analog input signal according to a LO signal; and
obtaining the corresponding digital signal by sampling the analog input signal according to a sampling clock signal.

19. The control method of claim 18, further comprising:
emitting a transmitting signal according to the LO signal.

20. The control method of claim 18, wherein each of the radar units respectively includes 1st to Mth sub-processing units,
wherein the 1st to Kth sub-processing units are used for implementing the first data processing and the k+1th to Mth sub-processing units are used for implementing the second data processing, wherein M is a natural number greater than or equal to 2 and K is a natural number greater than or equal to 1 and less than M.

21. The control method of claim 20, wherein the 1st to Mth sub-processing units respectively perform at least part of processes of the following data processing: Fourier transform, target detection, angle detection, and point cloud imaging.

22. The control method of claim 18, wherein the plurality of radar units comprise a master radar unit and a plurality of slave radar units, and wherein when the plurality of radar units work jointly, the master radar unit generates and transmits the LO signal and the sampling clock signal to the plurality of slave radar units.

23. The control method of claim 22, wherein the master radar unit is cascaded with the plurality of slave radar units in sequence.

24. The control method according to claim 23, wherein:
each of the radar units that is not the last one in a sequence provides for a next radar unit in sequence addresses corresponding to the intermediate data of the current radar unit, or the addresses combined with addresses provided by a former radar unit in sequence, thereby obtaining final addresses in the last radar unit; and
each of the slave radar units transmits the respective intermediate data in a direct manner or through a former slave radar unit in sequence to the master radar unit, so that the master radar unit, as the designated radar unit, generates the result data.

25. The control method according to claim 23, wherein:
each of the radar units that is not the last one in sequence provides for a next radar unit in sequence addresses corresponding to the intermediate data of the current radar unit, or the addresses combined with the addresses provided by a former radar unit in sequence, and transmits the intermediate data of the current radar unit and all the former radar units to the next radar unit; and
the last slave radar unit in sequence, as the designated radar unit, generates the result data according to the addresses provided by the former radar unit right before the last slave radar unit and all the intermediate data provided by the former radar units in sequence.

26. The control method of claim 23, wherein:
each of the radar units that is not the last one in sequence provides for a next radar unit in sequence the intermediate data of the current radar unit, or the data combined with the intermediate data provided by a former radar unit in sequence; and
the last slave radar unit in sequence, as the designated radar unit, generates the result data according to the data provided by the former radar unit.

27. The control method of claim 16, wherein each of the radar units realizes synchronization and data exchange through a bus structure.

28. The control method of claim 16, wherein the intermediate data is a result from one of the 1D-FFT, a second-dimensional fast Fourier transform (2D-FFT), target detection, or a combination thereof.

29. The control method of claim 16, wherein the plurality of radar units includes at least first, second, and third radar units, and wherein when the plurality of radar units work jointly, the target address and the information of the corresponding 2D-FFT acquired after the respective target detection performed in the first radar unit are delivered to the second radar unit, and the second radar unit is configured to create a combination of the target address and the information of the corresponding 2D-FFT acquired after the respective target detection performed in the second radar unit together with what is delivered from the first radar unit and further deliver the combination to the third radar unit.

* * * * *